US006455421B1

(12) United States Patent
Itoh et al.

(10) Patent No.: US 6,455,421 B1
(45) Date of Patent: Sep. 24, 2002

(54) PLASMA TREATMENT OF TANTALUM NITRIDE COMPOUND FILMS FORMED BY CHEMICAL VAPOR DEPOSITION

(75) Inventors: Toshio Itoh, Palo Alto; Michael X. Yang, Fremont; Christophe Marcadal, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/629,778

(22) Filed: Jul. 31, 2000

(51) Int. Cl.[7] .................... H01L 21/44; H01L 21/4763; H01L 21/31; H01L 21/409; H01L 21/26
(52) U.S. Cl. .................. 438/656; 438/648; 438/681; 438/785; 438/793; 438/798
(58) Field of Search ................. 438/586, 627, 438/643, 648, 653, 656, 660, 681, 785, 793, 794, 795, 798

(56) References Cited

U.S. PATENT DOCUMENTS

| 5,668,054 | A | | 9/1997 | Sun et al. .................... 438/653 |
|---|---|---|---|---|
| 5,989,999 | A | | 11/1999 | Levine et al. ................ 438/627 |
| 6,015,917 | A | | 1/2000 | Bhandari et al. .............. 556/12 |
| 6,153,519 | A | * | 11/2000 | Jain et al. .................... 438/681 |
| 6,204,204 | B1 | * | 3/2001 | Paranjpe et al. .......... 427/248.1 |
| 6,297,147 | B1 | * | 10/2001 | Yang et al. ................. 438/627 |

* cited by examiner

*Primary Examiner*—Richard Elms
*Assistant Examiner*—Adam Pyonin
(74) *Attorney, Agent, or Firm*—Moser, Patterson & Sheridan LLP

(57) ABSTRACT

A method of forming tantalum nitride (TaN) compound layers for use in integrated circuit fabrication processes is disclosed. The tantalum nitride (TaN) compound layer is formed by thermally decomposing a tantalum containing metal organic precursor. After the tantalum nitride (TaN) compound layer is formed, it is plasma treated.

29 Claims, 3 Drawing Sheets

PLASMA TREATMENT OF TANTALUM NITRIDE COMPOUND FILMS FORMED BY CHEMICAL VAPOR DEPOSITION

BACKGROUND OF THE DISCLOSURE

1. Field of the Invention

The invention relates to a method of tantalum nitride film deposition and, more particularly, to a method of forming a tantalum nitride compound film having good step-coverage and low resistivity.

2. Description of the Background Art

In the manufacture of integrated circuits, tantalum nitride (TaN) films are often used as barrier layers to inhibit the diffusion of metals into regions underlying the barrier layer. These underlying regions include transistor gates, capacitor dielectric, semiconductor substrates, metal lines, and many other structures that appear in integrated circuits. Tantalum nitride (TaN), for example, is often used as a diffusion barrier for copper (Cu) metallization.

TaN layers are typically formed using physical vapor deposition (PVD) and/or chemical vapor deposition (CVD) techniques. For example, tantalum may be sputtered from a tantalum target in the presence of a nitrogen source to form TaN films using PVD. However, as the dimensions of integrated circuit features are reduced (e. g., integrated circuit dimensions less than about 0.2 $\mu$m (micrometers)) the step coverage of PVD deposited TaN films may become poor. The step coverage of a film is a measure of how well such film maintains its nominal thickness as it crosses steps that occur on the surface of a substrate. Step coverage is expressed as the ratio of the minimum thickness of a film as it crosses a step to the nominal thickness of the film on flat regions.

CVD TaN films may be formed by thermally decomposing a tantalum containing metal-organic precursor or by reacting such tantalum containing metal-organic precursor with a nitrogen source. For example, TaN is formed when pentakis(dimethylamido) tantalum (abbreviated PDEAT) ($Ta(N(CH_3)_2)_5$) decomposes or when pentakis(dimethylamido) tantalum ($Ta(N(CH_3)_2)_5$) reacts with ammonia ($NH_3$).

TaN films formed by reacting pentakis(dimethylamido) tantalum ($Ta(N(CH_3)_2)_5$) with ammonia typically have a low resistivity (e.g., resistivity of about 1,000 $\mu$ohm-cm), but poor step coverage. Conversely, TaN films formed from the decomposition of pentakis(dimethylamido) tantalum ($Ta(N(CH_3)_2)_5$) typically have good step coverage, but high resistivity (e.g., resistivity of about 100,000 $\mu$ohm-cm).

Therefore, a need exists in the art for a method of forming TaN films having good step coverage and low resistivity.

SUMMARY OF THE INVENTION

A method of forming tantalum nitride (TaN) compound layers for use in integrated circuit fabrication processes is provided. The tantalum nitride (TaN) compound layer is formed by thermally decomposing a tantalum containing metal organic precursor. After the tantalum nitride (TaN) compound layer is formed, it is plasma treated. The tantalum nitride (TaN) compound layer is preferably plasma treated with an argon (Ar) based plasma.

The tantalum nitride (TaN) compound layer is compatible with integrated circuit fabrication processes. In one integrated circuit fabrication process, the tantalum nitride (TaN) compound layer is used as a barrier layer for fabricating integrated circuit structures such as, for example, vias. For such an integrated circuit fabrication process, a preferred process sequence includes providing a substrate having a dielectric material thereon. The dielectric material has vias therein. A tantalum nitride (TaN) compound layer is formed on the dielectric material by thermally decomposing a tantalum containing metal organic precursor. After the tantalum nitride (TaN) compound layer is formed on the dielectric material, it is plasma treated, preferably with an argon (Ar) based plasma. Thereafter, the integrated circuit structure is completed by filling the vias with a conductive material.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
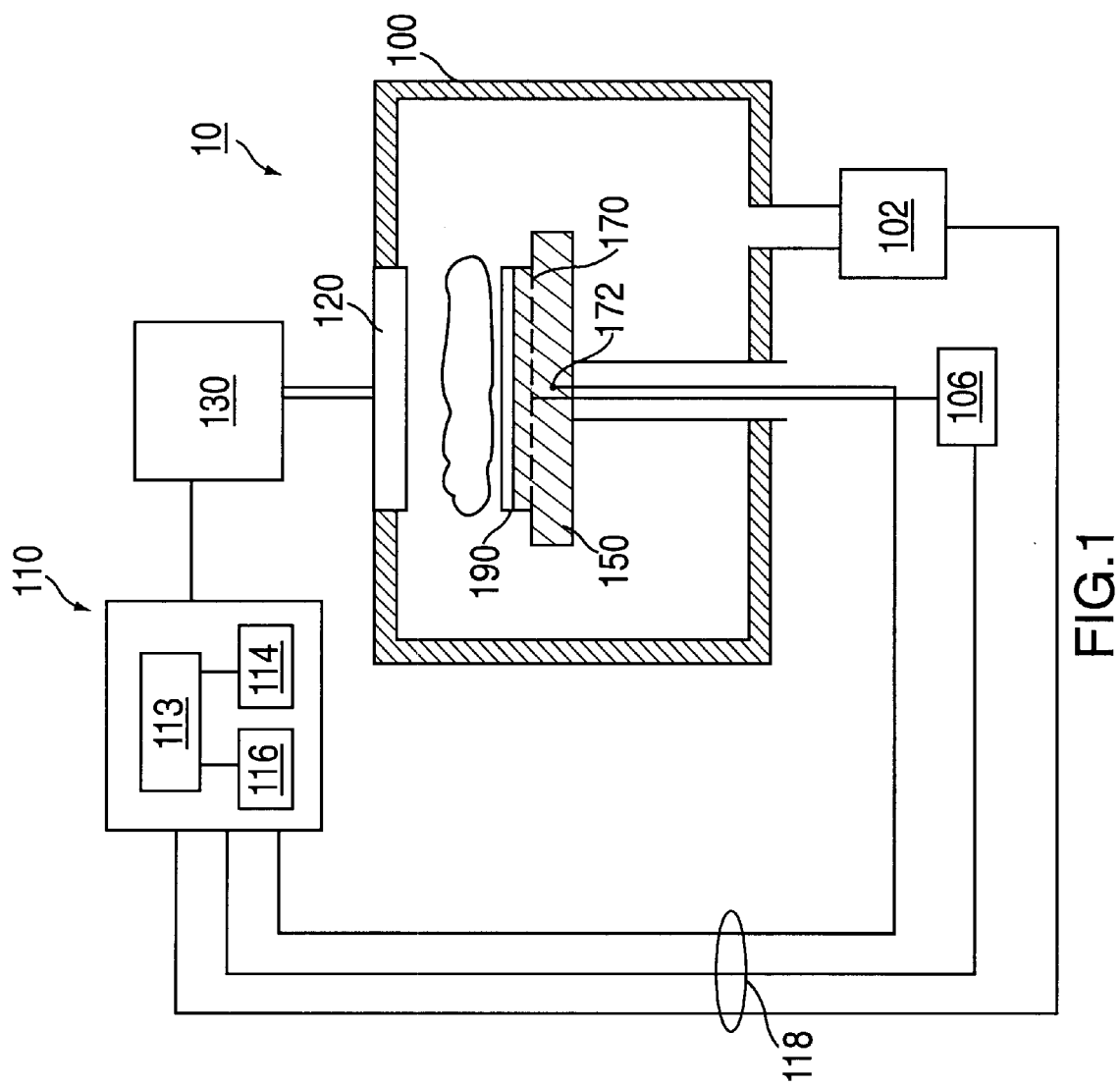
FIG. 1 depicts a schematic illustration of an apparatus that can be used for the practice of embodiments described herein.

FIG. 1 is a schematic representation of a wafer processing system 10 that can be used to perform tantalum nitride (TaN) compound film formation in accordance with embodiments described herein. System 10 typically comprises a process chamber 100, a gas panel 130, a control unit 110, along with other hardware components such as power supplies 106 and vacuum pumps 102. One example of the process chamber 100 has been previously described in commonly assigned U.S. patent application Ser. No. 09/211,998, entitled "High Temperature Chemical Vapor Deposition Chamber", filed Dec. 14, 1998, and is herein incorporated by reference. The salient features of this system 10 are briefly described below.

Chamber 100

The process chamber 100 generally houses a support pedestal 150, which is used to support a substrate such as a semiconductor wafer 190. This pedestal 150 can typically be moved in a vertical direction inside the chamber 100 using a displacement mechanism (not shown).

Depending on the specific process, the wafer 190 can be heated to some desired temperature prior to the tantalum nitride (TaN) compound film deposition. For example, the wafer support pedestal 150 is heated by an embedded heater element 170. The pedestal 150 may be resistively heated by applying an electric current from an AC power supply 106 to the heater element 170. The wafer 190 is, in turn, heated by the pedestal 150.

A temperature sensor 172, such as a thermocouple, is also embedded in the wafer support pedestal 150 to monitor the temperature of the pedestal 150 in a conventional manner. The measured temperature is used in a feedback loop to control the power supplied to the heater element 170, such that the wafer temperature can be maintained or controlled at a desired temperature which is suitable for the particular process application. The pedestal is optionally heated using radiant heat (not shown).

A vacuum pump 102, is used to evacuate the process chamber 100 and to maintain the proper gas flows and pressure inside the chamber 100. A showerhead 120, through which process gases are introduced into the chamber 100, is located above the wafer support pedestal 150. The showerhead 120 is coupled to a gas panel 130, which controls and supplies various gases used in different steps of the process sequence.

The showerhead 120 and the wafer support pedestal 150 also form a pair of spaced apart electrodes. When an electric field is generated between these electrodes, the process gases introduced into the chamber 100 are ignited into a plasma. Typically, the electric field is generated by connecting the wafer support pedestal 150 to a source of radio frequency (RF) power (not shown) through a matching network (not shown). Alternatively, the RF power source and matching network may be coupled to the showerhead 120, or coupled to both the showerhead 120 and the wafer support pedestal 150.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Proper control and regulation of the gas flows through the gas panel 130 is performed by mass flow controllers (not shown) and the controller unit 110. The showerhead 120 allows process gases from the gas panel 130 to be uniformly introduced and distributed in the process chamber 100.

Illustratively, the control unit 110 comprises a central processing unit (CPU) 113, support circuitry 114, and memories containing associated control software 116. The control unit 110 is responsible for automated control of the numerous steps required for wafer processing—such as wafer transport, gas flow control, RF power control, temperature control, chamber evacuation, and other steps. Bi-directional communications between the control unit 110 and the various components of the wafer processing system 10 are handled through numerous signal cables collectively referred to as signal buses 118, some of which are illustrated in FIG. 1.

The central processing unit (CPU) 113 may be one of any form of general purpose computer processor that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Process sequence routines as required may be stored in the memory or executed by a second CPU that is remotely located.

The process sequence routines are executed after the substrate 190 is positioned on the wafer support pedestal 150. The process sequence routines, when executed, transform the general purpose computer into a specific process computer that controls the chamber operation so that the deposition process is performed. Alternatively, the chamber operation may be controlled using remotely located hardware, as an application specific integrated circuit or other type of hardware implementation, or a combination of software or hardware.

Figure 2:
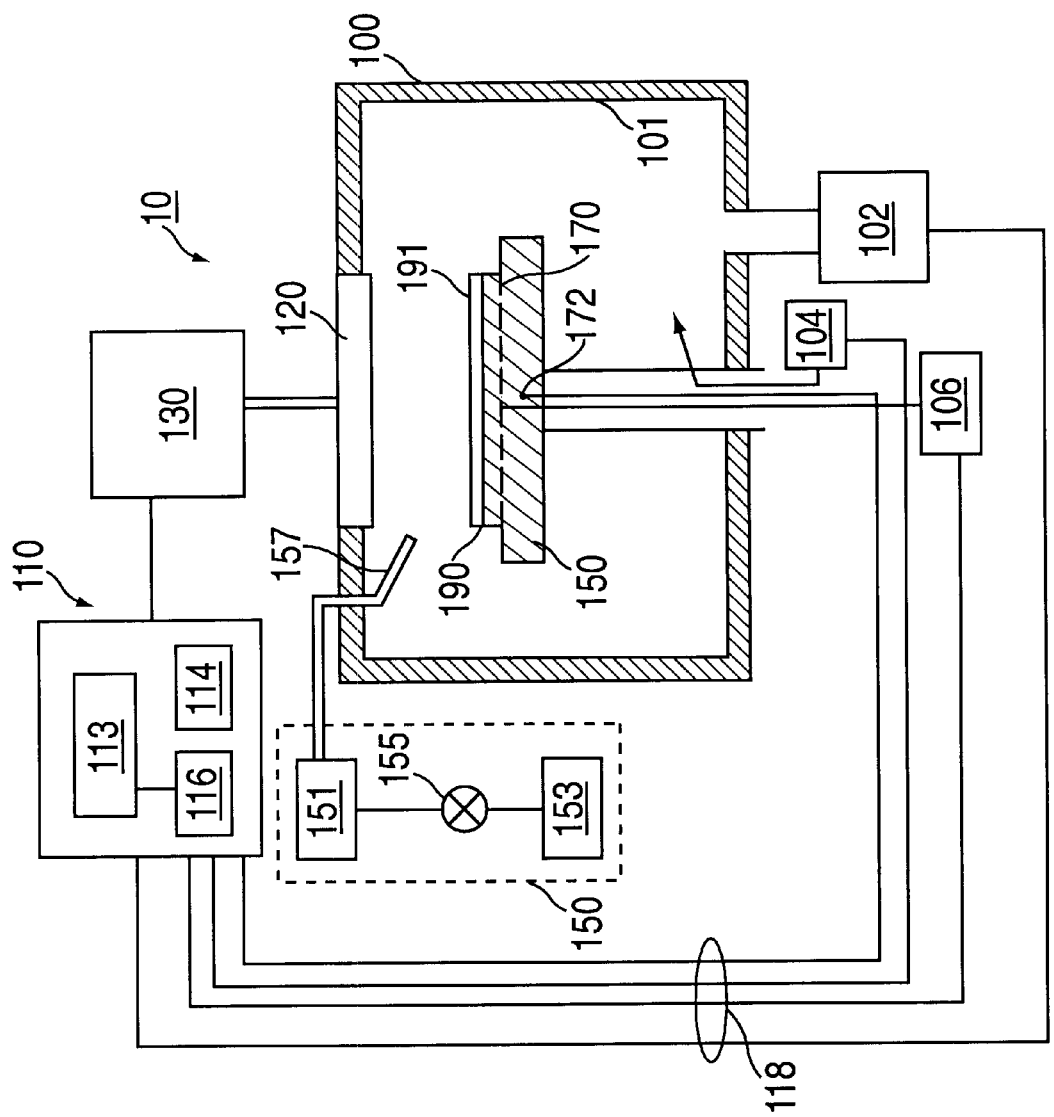
FIG. 2 depicts a schematic illustration of an alternate apparatus including a remote plasma source that can be used for the practice of embodiments described herein.

Optionally, a remote plasma source 150 may be coupled to wafer processing system 10, as shown in FIG. 2, to provide a remotely generated plasma to the process chamber 100. The remote plasma source 150 includes a gas supply 153, a gas flow controller 155, a plasma chamber 151, and a chamber inlet 157. The gas flow controller 155 controls the flow of process gas from the gas supply 153 to the plasma chamber 151.

A remote plasma may be generated by applying an electric field to the process gas in the plasma chamber 151, creating a plasma of reactive species. Typically, the electric field is generated in the plasma chamber 151 using a RF power source (not shown). The reactive species generated in the remote plasma source 150 are introduced into the process chamber 100 through inlet 157.

Tantalum Nitride (TaN) Compound Layer Integration

The following embodiment is a method for tantalum nitride (TaN) compound layer integration, which advantageously provides tantalum nitride (TaN) compound layers with good step coverage and a low resistivity.

Figure 3A:
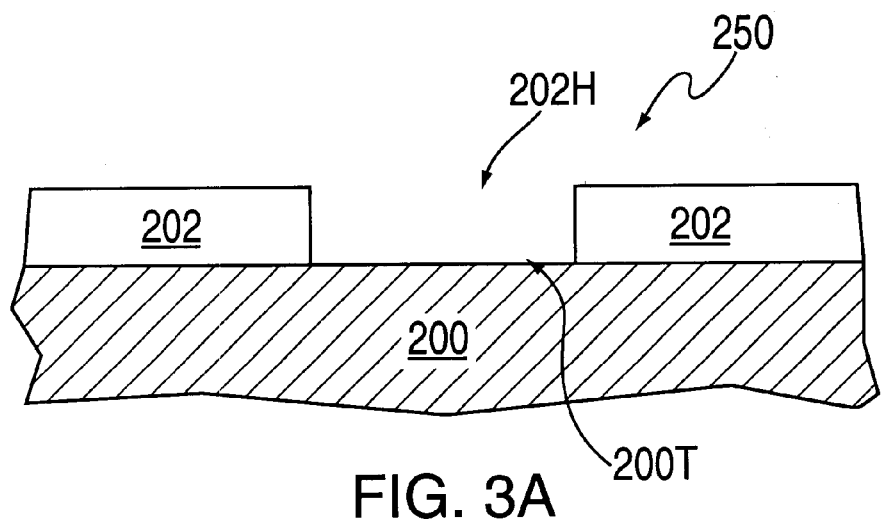
FIGS. 3a–3c depict schematic cross-sectional views of an integrated circuit structure at different stages of a fabrication sequence incorporating a tantalum nitride (TaN) compound layer.
Figure 3B:
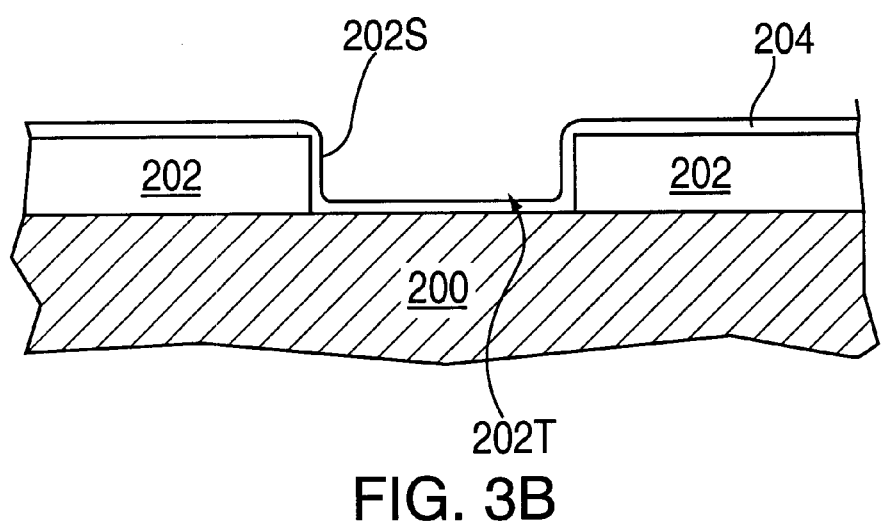
Figure 3C:
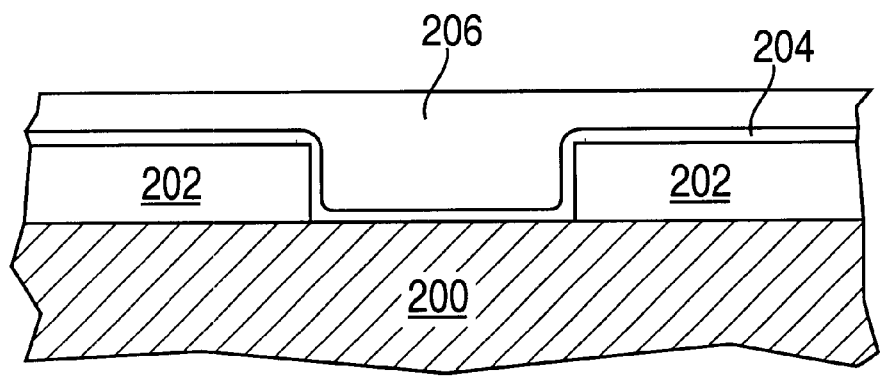

FIGS. 3a–3c illustrate an integrated circuit structure at different stages of a fabrication sequence, incorporating a tantalum nitride (TaN) compound barrier layer. In general, the substrate 200 refers to any workpiece upon which film processing is performed, and a substrate structure 250 is used to generally denote the substrate 200 as well as other material layers formed on the substrate 200.

Depending on the specific stage of processing, the substrate 200 may be a silicon semiconductor wafer, or other material layer, which has been formed on the wafer. FIG. 3a, for example, shows a cross-sectional view of a substrate structure 250, having a material layer 202 thereon. In this particular illustration, the material layer 202 may be an oxide (e.g., silicon dioxide, fluorosilicate glass (FSG), undoped silicate glass (USG)). The material layer 202 has been conventionally formed and patterned to provide a contact hole 202H having sidewalls 202S, and extending to the top surface 200T of the substrate 200.

FIG. 3b depicts a tantalum nitride (TaN) compound layer 204 formed on the substrate structure 250 of FIG. 3a. The tantalum nitride (TaN) compound layer 204 is formed by thermally decomposing a tantalum containing metal organic precursor. The tantalum containing metal organic precursor may be selected, for example, from the group of pentakis (diethylamido) tantalum (PDEAT) (Ta(NEt$_2$)$_5$), pentakis (ethylmethylamido) tantalum (PEMAT) (Ta(N(Et)(Me))$_5$), pentakis(dimethylamido) tantalum (PDMAT) (Ta(NMe$_2$)$_5$), tetrakis(ethylmethylamido) tantalum (TEMAT) (Ta(N(Et)(Me))$_4$), tetrakis(diethylamido) tantalum (TDEAT) (Ta(NEt$_2$)$_4$), tetrakis(dimethylamido) tantalum (TDMAT) (Ta(NMe$_2$)$_4$), among others.

Carrier gases such as hydrogen (H$_2$), helium (He), argon (Ar), nitrogen (N$_2$), among others may be mixed with the tantalum containing metal organic precursor.

In general, the following deposition process parameters can be used to form the tantalum nitride (TaN) compound layer in a deposition chamber similar to that shown in FIG. 1. The process parameters range from a wafer temperature of about 200° C. to about 600° C., a chamber pressure of about 0.1 torr to about 100 torr, a tantalum containing metal organic precursor flow rate of about 0.1 sccm to about 1000 sccm, and a carrier gas flow rate of about 10 sccm to about 10,000 sccm. The above process parameters provide a deposition rate for the tantalum nitride (TaN) compound layer in a range of about 0.1 Å/min to about 1,000 Å/min when implemented on a 200 mm (millimeter) substrate in a deposition chamber available from Applied Materials, Inc., located in Santa Clara, Calif.

Other deposition chambers are within the scope of the invention, and the parameters listed above may vary according to the particular deposition chamber used to form the tantalum nitride (TaN) compound layer. For example, other deposition chambers may have a larger (e.g., configured to accommodate 300 mm substrates) or smaller volume, requiring gas flow rates that are larger or smaller than those recited for deposition chambers available from Applied Materials, Inc.

The thermal decomposition of the tantalum containing metal organic precursor according to the process parameters described above provides tantalum nitride (TaN) compound layers that contain carbon (C). A typical composition for the tantalum nitride (TaN) compound layers includes tantalum (Ta), nitrogen (N), carbon (C), and oxygen (O) in a ratio of about 4Ta:2.5N:3C:0.50. As such, it is believed that the tantalum nitride (TaN) compound layers may include a mixture of both tantalum nitride (TaN) and tantalum carbide (TaC).

The thermal decomposition of the tantalum containing metal organic precursor advantageously forms tantalum nitride (TaN) compound layers with good step coverage. The thickness of the tantalum nitride (TaN) compound layer 204 is variable depending on the specific stage of processing. Typically, the tantalum nitride (TaN) compound layer 204 is deposited to a thickness of about 50 Å to about 100 Å.

After the tantalum nitride (TaN) compound layer 204 is formed on the substrate 200, it is plasma treated. The tantalum nitride (TaN) compound layer 204 is preferably plasma treated with an argon (Ar) based plasma. Carrier gases such as hydrogen ($H_2$), nitrogen ($N_2$), helium (He), among others may be mixed with the argon. Alternatively, a hydrogen ($H_2$) based plasma, or a helium (He) based plasma may be used to plasma treat the tantalum nitride (TaN) compound layer 204.

In general, the following process parameters can be used to plasma treat the tantalum nitride (TaN) compound layer 204 in a process chamber similar to that shown in FIGS. 1 or 2. The process parameters range from a wafer temperature of about 200° C. to about 600° C., a chamber pressure of about 0.1 torr to about 100 torr, an argon gas flow rate of about 10 sccm to about 10,000 sccm, and a radio frequency (RF) power of about 50 watts to about 2,000 watts. The tantalum nitride (TaN) compound layer 204 is plasma treated for less than about 300 seconds.

The plasma treatment of the tantalum nitride (TaN) compound layer 204 is believed to densify such compound layer so as to reduce the resistivity thereof.

The plasma treatment of the tantalum nitride (TaN) compound layer 204 is optionally performed as a multi-step process, wherein the plasma treatment is followed by a chemical treatment step. For example, an argon-based (Ar) plasma may be used to treat the tantalum nitride (TaN) compound layer 204, followed by chemical treatment using, for example, silane ($SiH_4$).

It is believed that the plasma treatment of the tantalum nitride (TaN) compound layer has directionality. In particular, an argon-based plasma is believed to be effective for lowering the resistivity of tantalum nitride (TaN) compound surfaces that are parallel to the wafer surface (e.g., surfaces 202T of hole 202H). Additionally, as the hydrogen-content of the argon-based plasma is increased the resistivity of the tantalum nitride (TaN) compound layer 204 also increased. Chemical treatment of the tantalum nitride (TaN) compound layer 204 using, for example, silane ($SiH_4$) gas is believed to reduce the resistivity of surfaces that are perpendicular to the wafer surface (e.g., surfaces 202S of hole 202H).

Additional tantalum nitride (TaN) compound layers may optionally be deposited one over another so as to form tantalum nitride (TaN) compound layers having thicknesses in a range of about 30 Å to about 5,000 Å. After each tantalum nitride (TaN) compound layer is formed it is plasma treated to reduce the resistivity thereof.

Referring to FIG. 3c, after the tantalum nitride (TaN) compound layer 204 is deposited and plasma treated, the holes 202H are filled with a conductive material 206 such as, for example, aluminum (Al), copper (Cu), tungsten (W), and combinations thereof, among others. The conductive material 206 may be deposited using chemical vapor deposition (CVD), physical vapor deposition (PVD), electroplating, or combinations thereof.

Although several preferred embodiments which incorporate the teachings of the present invention have been shown and described in detail, those skilled in the art can readily devise many other varied embodiments that still incorporate these teachings.

What is claimed is:

1. A method of thin film deposition for integrated circuit fabrication, comprising the steps of:
    (a) forming a tantalum nitride (TaN) compound layer on a substrate;
    (b) plasma treating the tantalum nitride (TaN) compound layer; and
    (c) exposing the plasma treated tantalum nitride (TaN) compound layer to a silane ($SiH_4$) based atmosphere.

2. The method of claim 1 wherein step (a), comprises:
    positioning the substrate in a deposition chamber;
    providing a gas mixture to the deposition chamber wherein the gas mixture comprises a tantalum (Ta) containing metal organic precursor; and
    thermally decomposing the Ta containing metal organic precursor to form a tantalum nitride (TaN) compound layer on the substrate.

3. The method of claim 2 wherein the gas mixture further comprises a carrier gas.

4. The method of claim 3 wherein the carrier gas is selected from the group of hydrogen ($H_2$), argon (Ar), helium (He), nitrogen ($N_2$), and combinations thereof.

5. The method of claim 2 wherein the Ta containing metal organic precursor is selected from the group of pentakis (diethylamido)tantalum (PDEAT) (Ta($NEt_2$)$_5$), pentakis (ethylmethylamido)tantalum (PEMAT) (Ta(N(Et)(Me))$_5$), pentakis(dimethylamido) tantalum (PDMAT)(Ta($NMe_2$)$_5$), tetrakis(ethylmethylamido)tantalum (TEMAT) (Ta(N(Et)(Me))$_4$), tetrakis(diethylamido)tantalum (TDEAT) (Ta(N($Et_2$)$_4$), tetrakis(dimethylamido)tantalum (TDMAT) (Ta($NMe_2$)$_4$), and combinations thereof.

6. The method of claim 2 wherein the substrate is heated to a temperature of between about 200° C. to about 600° C.

7. The method of claim 2 wherein the deposition chamber is maintained at a pressure between about 0.1 torr to about 100 torr.

8. The method of claim 2 wherein the tantalum containing metal organic precursor is provided to the deposition chamber at a flow rate in a range of about 0.1 sccm to about 1,000 sccm.

9. The method of claim 3 wherein the carrier gas is provided to the deposition chamber at a flow rate in a range of about 10 sccm to about 10,000 sccm.

10. The method of claim 1 wherein the plasma of step (b) is generated by
    providing a gas mixture to a process chamber; and
    applying an electric field to the gas mixture in the process chamber to generate the plasma.

11. The method of claim 10 wherein the gas mixture comprises one or more gases selected from the group of molecular hydrogen ($H_2$), argon (Ar), helium (He), and nitrogen ($N_2$).

12. The method of claim 10 wherein the process chamber is maintained at a pressure in a range of about 0.1 torr to about 100 torr.

13. The method of claim 10 wherein the gas mixture is provided to the process chamber at a flow rate in a range of about 10 sccm to about 10,000 sccm.

14. The method of claim 10 wherein the electric field is a radio frequency (RF) power.

15. The method of claim 14 wherein the RF power is in a range of about 50 watts to about 2,000 watts.

16. The method of claim 10 wherein the plasma is generated in a process chamber used for tantalum nitride (TaN) compound layer deposition.

17. The method of claim 10 wherein the plasma is generated in a process chamber that is coupled to a process chamber used for tantalum nitride (TaN) compound layer deposition.

18. The method of claim 1 wherein step (b) comprises:
plasma treating the tantalum nitride (TaN) compound layer using an argon (Ar) based plasma.

19. A method of thin film deposition for integrated circuit fabrication, comprising the steps of:
(a) forming a tantalum nitride (TaN) compound layer on a substrate from a Ta containing metal organic precursor;
(b) plasma treating the tantalum nitride (TaN) compound layer; and
(c) exposing the plasma treated tantalum nitride (TaN) compound layer to a silane ($SiH_4$) based atmosphere.

20. The method of claim 19 wherein the Ta containing metal organic precursor is selected from the group of pentakis(diethylamido)tantalum (PDEAT)(Ta($NEt_2$)$_5$), pentakis(ethylmethylamido)tantalum (PEMAT) (Ta(N(Et)(Me))$_5$), pentakis(dimethylamido)tantalum (PDMAT)(Ta($NMe_2$)$_5$), tetrakis (ethylmethylamido)tantalum (TEMAT) (Ta(N(Et)(Me))$_4$), tetrakis(diethylamido)tantalum (TDEAT) (Ta(N$Et_2$)$_4$), tetrakis(dimethylamido)tantalum (TDMAT) (Ta($NMe_2$)$_4$), and combinations thereof.

21. The method of claim 19 wherein the substrate is heated to a temperature between 200° C. to about 600° C.

22. The method of claim 19 wherein the tantalum nitride (TaN) compound layer is formed at a pressure between about 0.1 torr to about 100 torr.

23. The method of claim 19 wherein the tantalum nitride (TaN) compound layer is plasma treated in the presence of one or more gases selected from the group consisting of molecular hydrogen ($H_2$), argon (Ar), helium (He), and nitrogen ($N_2$).

24. A method of thin film deposition for integrated circuit fabrication, comprising the steps of;
(a) forming a tantalum nitride (TaN) compound layer on a substrate from a Ta containing metal organic precursor;
(b) plasma treating the tantalum nitride (TaN) compound layer in the presence of one or more gases selected from the group consisting of molecular hydrogen ($H_2$), argon (Ar), helium (He), and nitrogen ($N_2$); and
(c) exposing the plasma treated tantalum nitride (TaN) compound layer to a silane ($SiH_4$) based atmosphere.

25. The method of claim 24 wherein the Ta containing metal organic precursor is selected from the group of pentakis(diethylamido)tantalum (PDEAT)(Ta($NEt_2$)$_5$), pentakis(ethylmethylamido)tantalum (PEMAT) (Ta(N(Et)(Me))$_5$), pentakis(dimethylamido)tantalum (PDMAT) (Ta($NMe_2$)$_5$), tetrakis (ethylmethylamido)tantalum (TEMAT) (Ta(N(Et)(Me))$_4$), tetrakis(diethylamido)tantalum (TDEAT) (Ta(N$Et_2$)$_4$), tetrakis(dimethylamido)tantalum (TDMAT) (Ta($NMe_2$)$_4$), and combinations thereof.

26. The method of claim 24 wherein the substrate is heated to a temperature between 200° C. to about 600° C.

27. The method of claim 24 wherein the tantalum nitride (TaN) compound layer is formed at a pressure between about 0.1 torr to about 100 torr.

28. The method of claim 24 wherein the tantalum nitride (TaN) compound layer is plasma treated in the presence of argon (Ar).

29. The method of claim 24 wherein the tantalum nitride (TaN) compound layer is plasma treated in the presence of molecular hydrogen ($H_2$).

\* \* \* \* \*